United States Patent [19]
Ravetto et al.

[11] Patent Number: 5,794,331
[45] Date of Patent: Aug. 18, 1998

[54] PROCESS FOR THE EXCHANGE OF A DETECTION MODULE HYBRIDIZED BY WELDING BUMPS

[75] Inventors: Michel Ravetto, Meylan; Jean-Paul Chamonal, Ismier; François Marion, Saint Egreve; Jean-Louis Pornin, Crolles, all of France

[73] Assignee: Commissariat a l'Energie Atomique, France

[21] Appl. No.: 647,934

[22] PCT Filed: Oct. 6, 1995

[86] PCT No.: PCT/FR95/01306

§ 371 Date: May 31, 1996

§ 102(e) Date: May 31, 1996

[87] PCT Pub. No.: WO96/11497

PCT Pub. Date: Apr. 18, 1996

[30] Foreign Application Priority Data

Oct. 6, 1994 [FR] France ................... 94 11948

[51] Int. Cl.[6] .................................... H05K 3/34
[52] U.S. Cl. ............ 29/840; 29/402.07; 29/402.08; 29/834; 228/119; 228/180.22; 228/191
[58] Field of Search ............. 29/840, 834, 836, 29/402.07, 402.08; 228/191, 264, 119, 180.22

[56] References Cited

U.S. PATENT DOCUMENTS 4,991,286 2/1991 Russo et al. .................. 29/840
5,086,558 2/1992 Grube et al. .................. 29/840
5,092,033 3/1992 Nishiguchi et al. .......... 29/840

FOREIGN PATENT DOCUMENTS 5183011 11/1993 Japan.

OTHER PUBLICATIONS

Johnson et al, Substrate Wiring Patterns for Partial–Good Integegrated–Circuit Chips, IBM Technical Disclosure Bulletin, vol. 25, No. 2, Jul., 1982, pp. 752–753.

Goldman et al, "Lead–Indium For Controlled–Collapse Chip Joining" 27th Electronic Components Conference, Arlington, VA, May 16–18, 1977, pp. 25–29.

*Primary Examiner*—Peter Vo
*Assistant Examiner*—Rick K. Chang
*Attorney, Agent, or Firm*—Hayes, Soloway, Hennessey, Grossman & Hage, P.C.

[57] ABSTRACT

A process for exchanging a detection module hybridized by welding beads, balls or bumps, employs an interconnection support having first and second groups of welding elements. The module to be hybridized is provided with blocks wettable by the weld, and positioned facing elements of the first group during hybridization. A replacement module is provided with blocks wettable by the weld and positioned facing elements of the second group during hybridization. The module which has been hybridized is dehybridized, and the replacement module is hybridized by means of the second group of elements.

11 Claims, 6 Drawing Sheets

PROCESS FOR THE EXCHANGE OF A DETECTION MODULE HYBRIDIZED BY WELDING BUMPS

DESCRIPTION

The present invention relates to a process for exchanging a radiation detection module hybridized by welding bumps. It applies to the fields of microrelectronics and optoelectronics.

The radiation can be infrared, X or Y radiation.

The present invention e.g. makes it possible to repair a microelectronic device constituted by several elementary modules, e.g. infrared radiation detection modules, when the device is no longer operating as a result of one of its modules being defective.

The infrared detection elements, also known as pixels or photosites, of each module are located in a plane known as the detection plane of the microelectronic device. The repair to the latter, involving the exchange of the defective module, must make it possible to have identical detection elements in a very precise spatial position so that they are precisely arranged (in accordance with three orthogonal angles x, y, z) in the same way as the detection elements of the replaced module and still in the detection plane of the device.

These modules are joined end to end and hybridized by welding bumps, using flip-chip technology, to e.g. an interconnection network support or reading circuit.

The invention makes it possible to replace the defective module by a module of the same type, without modifying the initial specifications of the device.

The process according to the invention respects all the electrical specifications, but aims more particularly at respecting the very precise, spatial positioning specifications (in accordance with x, y and z) of the pixels of the module replacing a defective module and which has been hybridized to the support of the interconnection network of the microelectronic device.

Microelectronic devices of the type described hereinbefore are very costly on the one hand because they result from a complex microelectronic techology, the operating frequencies being ever higher, and on the other hand because said devices comprise an ever larger number of elementary modules which it is wished to group in the same system in order to improve the global characteristics thereof. It is also very difficult to produce such microelectronic devices.

Their manufacture can be prejudiced if the means do not exist for exchanging, after assembly and measurements, one or more elementary modules which prove to be defective or not in accordance with the specifications provided by the user.

Consideration will e.g. be given to an infrared detection device diagrammatically shown in FIG. 1. This detection device comprises modules 2 for the detection of an infrared radiation 3, which are joined to one another in order to obtain a "continuous line" of detection pixels or photosites (not shown) with no spacing loss and which are in a very precise, mutual, spatial position.

The materials CMT/CZT (C for cadmium, M for mercury, T for tellerium and Z for zinc), on which said photosites are produced, and the fabrication yield are conditions defining the relatively small size of each of the detection modules 2.

The device diagrammatically shown in FIG. 1 also comprises modules 4 for reading informations supplied by the photosites. These reading modules 4 are produced on silicon and arranged on either side of the detection modules 2. All these modules 2 and 4 are hybridized by not shown, indium bumps on a silicon or sapphire interconnection network support 6.

FIG. 1 also shows input-output connections 8 provided on the interconnection network support 6. The modules 2 and 4 are hybridized to the support 6 by a self-alignment procedure described in French patent application 8905542 of Apr. 26, 1989 (cf. alsoEP-A-395488 and U.S. Pat. No. 5,131, 584).

The interconnection network support makes it possible to electrically connect over short distances the individual modules and to produce the input-output interfaces of the device.

FIG. 2A is a diagrammatic, partial view of the face of one of the detection modules 2 on the side of which the photosites are located. FIG. 2A shows certain of the photosites 10 of the module arranged in staggered manner so as to define a detection plane.

FIG. 2A also shows the median axis X of the detection module 2, on either side of which are located the photosites.

FIG. 2B is a diagrammatic, partial sectional view of the detection modules 2, which are joined end to end and hybridized to the interconnection network support 6 by indium bumps 12.

Typically the following values are used for the device of FIGS. 1 to 2B:

dimensions of each detection module: 3×9 mm$^2$, square photosite of side C equal to 40 µm, staggered arrangement of the photosites with a spacing P of 80 µm, thickness E1 of each detection module 2: 400 µm, thickness E2 of indium bumps: 20 µm, thickness E3 of interconnection network support: 500 µm.

As a result of the aforementioned self-alignment method, all the modules respect, following hybridization, very precise spatial positioning specifications, defined by the volume of the indium bumps and by the wettable surfaces produced on the interconnection network support 6 made from silicon and to which are fixed the indium bumps.

FIGS. 3A to 3D explain certain of the specifications which must be respected by the detection modules.

FIG. 3A is a diagrammatic sectional view showing the detection modules 2 hybridized to the support 6 in an ideal case.

FIG. 3A shows photosites 10, associated with blocks 14 for the connection of the modules 2, as well as the indium bumps 12 connecting these blocks 14 to connection blocks 16 carried by a face F of the support 6, said face constituting a reference plane of the photosites.

FIG. 3B diagrammatically illustrates in exaggerated form the natural deformation of the interconnection network support 6.

FIG. 3C diagrammatically illustrates the alignment of the detection modules 2, where the medium axes X of these modules coincide with the general, theoretical, alignment line Y of said modules. It also illustrates the continuity in the positions of the photosites 10, whose spacing P is retained between the individual modules, including between two modules.

In FIG. 3C, the edge of a photosite located on one side of the axis X is "aligned" with the edge of a photosite located on the other side of said axis. With a view to maintaining the spacing P, the choice is then made of using parallelogram-shaped modules.

FIG. 3D illustrates diagrammatically and in exaggerated form the real case where said median axes X do not coincide with the general, theoretical alignment line Y.

Returning to the specifications mentioned hereinbefore, it is in particular pointed out that the detection modules respect the shape of the detection "plane" D. This detection plane is located at a constant altitude Z1 (FIGS. 3A and 3B), e.g. equal to 20 μm, and follows the natural deformation of the interconnection network support (which can be convex or alternatively hollow).

This deformation is approximately 10 μm on a silicon wafer with a diameter of 100 mm (FIG. 3B).

The detection modules also respect the "yaw", which corresponds to the positioning error of a detection module with respect to adjacent modules.

It is the angle formed by the median axis X of said module with the general, theoretical alignment line Y, which is defined by the technology used for manufacturing the interconnection network support (FIG. 3D).

Despite all these relative errors, the device complies with the specifications required of it.

As will be seen hereinafter, starting from these conditions and following the dehybridization of a defective module, the invention makes it possible to very precisely replace a new module respecting the same specifications.

FIGS. 4A and 4B show what would happen if an attempt was made to replace a defective detection module in the device of FIG. 1.

FIG. 4A shows the face of a detection module where are located the sensitive surfaces of the photosites 10 arranged in staggered manner and placed on either side of the median axis X of the module. FIG. 4A also shows the electrical connections 18 permitting the connection of the photosites 10 to the corresponding reading module 4 (FIG. 1) by means of the interconnection network support 6.

FIG. 4A also shows the connection blocks 14 of each detection module 2 and whose surfaces are wettable by indium. These blocks are obviously in electrical contact with the corresponding electrical connections 18.

In the example shown, each photosite 10 of a detection module is associated with two blocks 14 in order to obtain an electrical and thermal redundancy, as well as a better mechanical holding of said detection module on the interconnection network support.

During the hybridization, which is performed at the indium melting point, each of the connection blocks of the detection module is very accurately covered by an indium bump resulting from the melting of an indium wafer previously formed on the interconnection network support (cf. the aforementioned document).

In order to replace a defective module 2, it is firstly necessary to carry out a dehybridization, i.e. extraction operation with respect to said module. This operation is also performed at the melting point of indium.

Under these conditions, the volumes 12a of the indium bumps remaining on the interconnection network support following said extraction operation are reduced compared with the initial volumes (part 12b of the indium remaining on the dehybridized module) and in homogeneous, as is diagrammatically shown in FIG. 4B. There is consequently a double risk for the new module for replacing the defective module, with regards to the respecting of the specifications.

There is firstly a risk of a poor positioning, tilting and displacement of the altitude of the detection plane of said new module compared with the detection planes of the other modules. There is also a non-guaranteed rehybridization risk for all the photosites of said new module.

The present invention aims at obviating the aforementioned disadvantages.

The invention makes it possible for the new radiation detection module to be located very precisely in the position of the radiation detection module which it has replaced.

The invention makes it possible to hybridize the new module in an environment retaining the integrality of the volume of the indium balls or bumps.

More generally, the present invention makes it possible for the replacement module to be very precisely located in the position of a preceding module which it has replaced on an interconnection support (on which was hybridized the preceding module) and to hybridize said replacement module in an environment retaining the integrality of the volume of the weld bumps permitting hybridization.

The term "interconnection support" is understood to mean a substrate carrying an interconnection network and/or a component or device, whereof part is dedicated to the interconnection.

More specifically, the present invention relates to a process for exchanging a first detection module hybridized to an interconnection support by welding bumps, characterized in that the interconnection support is manufactured by providing it with at least one first group of welding elements for the hybridization of the first detection module to the interconnection support and at least one second group of welding elements for the hybridization of a second detection module replacing the first detection module, in that the first detection module is manufactured by providing it with connection blocks, whose surface is wettable by the weld and which are arranged in such a way as to be respectively located facing the elements of the first group of welding elements during hybridization, the zones of said first detection module intended for being positioned facing elements of the second group of welding elements during said hybridization being non-wettable by the weld, in that the replacement detection module is manufactured by providing it with connection blocks, whose surface is wettable by the weld and which are positioned so as to be respectively located facing elements of the second group of welding elements during the hybridization of said replacement detection module on the interconnection support, the zones of this replacement detection module which are to be positioned facing elements of the first group of welding elements during said hybridization being non-wettable by the weld, in that, for exchanging the first detection module hybridized by means of the first group of welding elements, dehybridization takes place of said first detection module and the replacement detection module is hybridized by means of the second group of welding elements, in that the second group of welding elements is deduced from the first group of welding elements by a 180° rotation about an axis perpendicular to the face of the interconnection support carrying said first and second groups of welding elements and in that the replacement detection module is hybridized on the interconnection support after having been placed in a position deduced, by said rotation, from the position occupied by the first detection module when it was hybridized.

Preferably, the detection elements of each module are symmetrically distributed with respect to an axis perpendicular to the face of the module carrying these detection elements. This makes it possible to use identical detection modules for carrying out hybridization and rehybridization.

Preferably, in order to ensure an electrical and thermal redundancy and/or a good mechanical holding of said first module and said replacement module, the support comprises two first groups of welding elements and two second groups of welding elements.

The welding elements used in the present invention for the hybridization operations can be welding bumps previously formed on the support.

However, according to a preferred embodiment of the invention, the welding elements of each of the first and second groups are welding wafers. This makes it possible to carry out the hybridization by self-alignment, as described in the aforementioned document.

The weld can be of a material chosen from within the group including indium, tin, lead and metal alloys, whose melting point does not exceed 350° C. and which contain indium, tin or lead (and optionally other materials such as e.g. bismuth or silver).

BRIEF DESCRIPTION OF THE DRAWINGS

The invention is described in greater detail hereinafter relative to non-limitative embodiments and with reference to the attached drawings, wherein show.

DETAILED DESCRIPTION OF THE DRAWINGS

An embodiment of the process according to the invention will now be described relative to FIGS. 5A to 7B. This special embodiment is explained using the example of the replacement of a radiation detection module hybridized to an interconnection network support, which is e.g. of silicon, by means of indium balls, beads or bumps.

Figure 1:
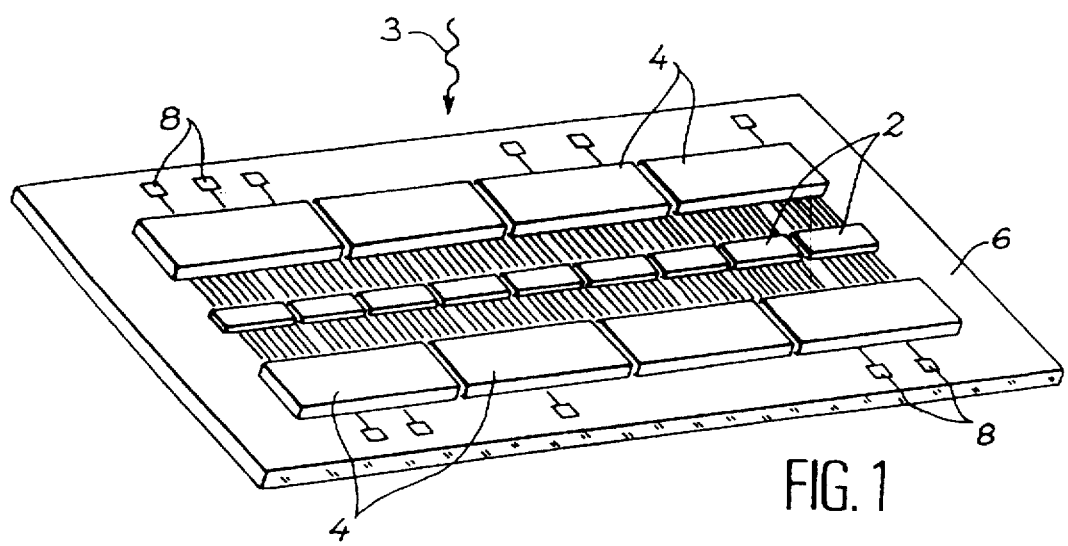
FIG. 1, already described, a diagrammatic perspective view of a known radiation detection device.
Figure 2A:
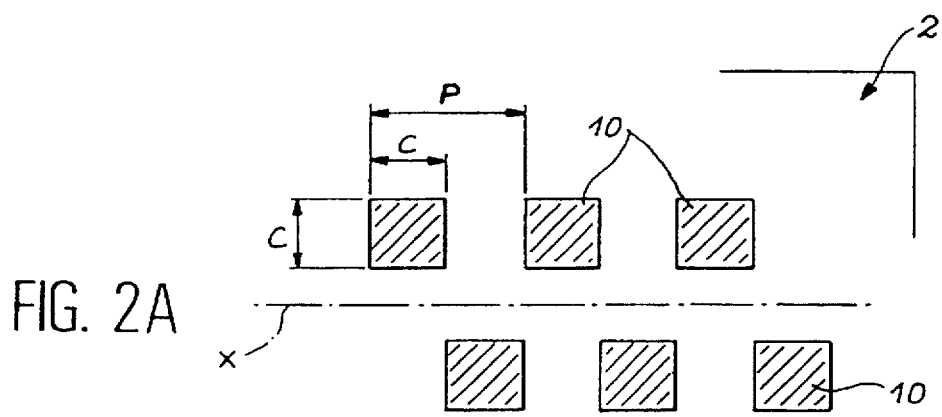
FIG. 2A, already described, photosites in the detection modules of the device of FIG. 1.
Figure 2B:
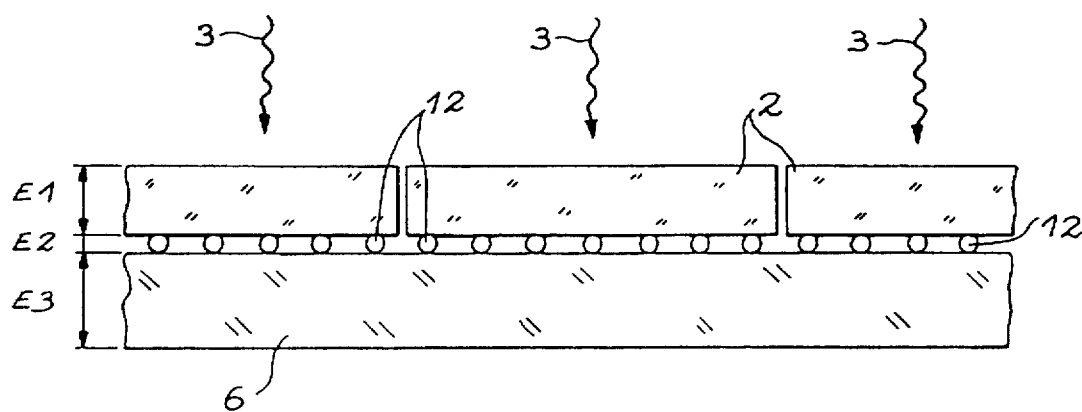
FIG. 2B, already described, a diagrammatic sectional view of the detection modules hybridized to an interconnection network support of the device of FIG. 1.
Figure 3A:
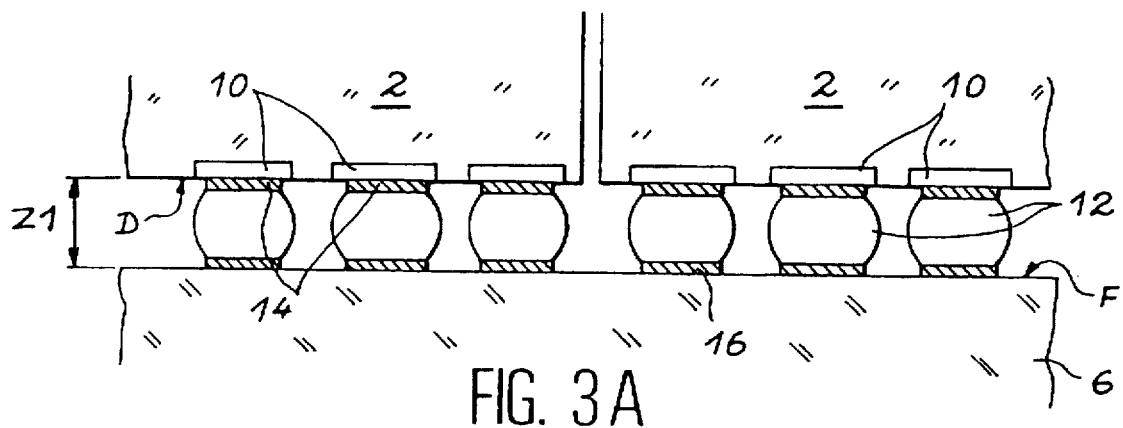
FIG. 3A, already described, diagrammatically an ideal hybridization of the detection modules to the support of the device of FIG. 1.
Figure 3B:
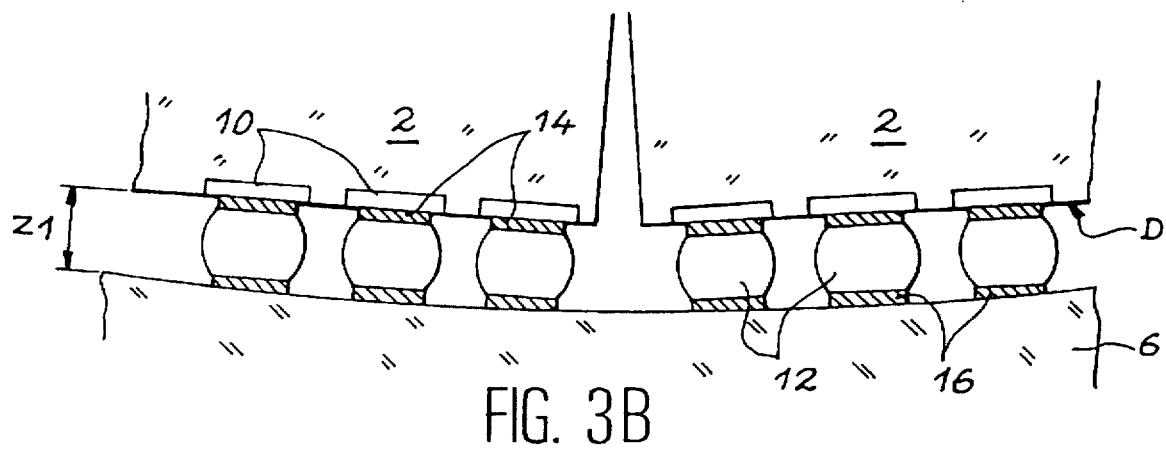
FIG. 3B, already described, diagrammatically and in exaggerated form a real hybridization of said modules.
Figure 3C:
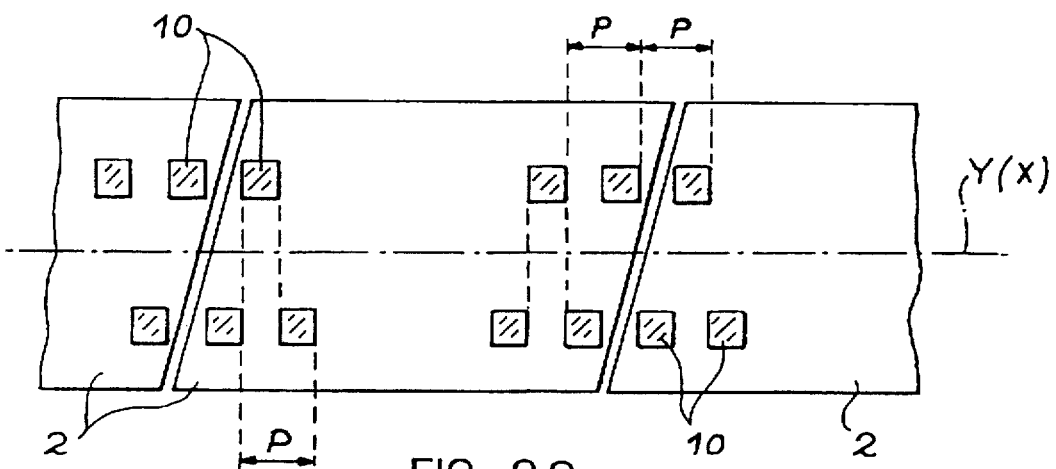
FIG. 3C, already described, diagrammatically an ideal alignment of the detection modules of the device of FIG. 1.
Figure 3D:
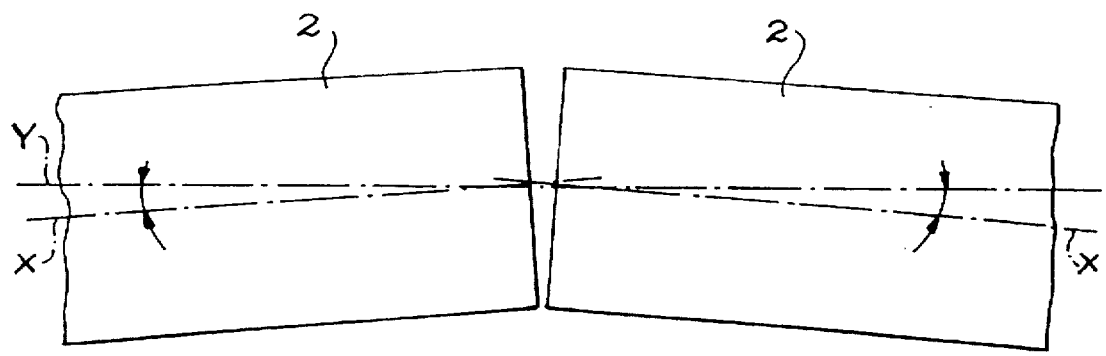
FIG. 3D, already described, diagrammatically and in exaggerated form, the yaw error existing in reality for these detection modules.
Figure 4A:
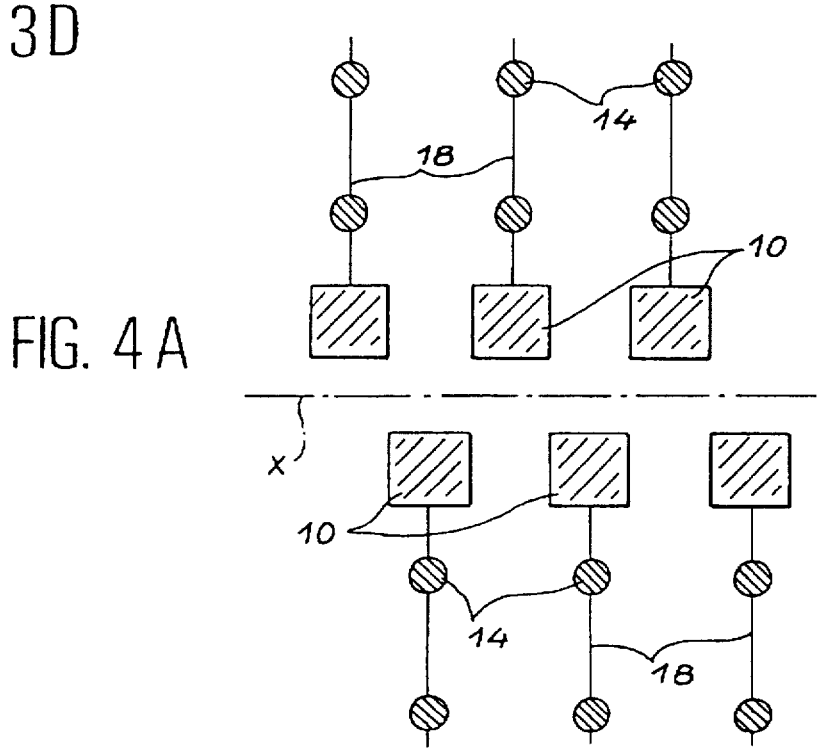
FIG. 4A, already described, diagrammatically the photosites of a detection module, which are associated with electrical connections connecting said photosites to the reading modules of the device of FIG. 1.
Figure 4B:
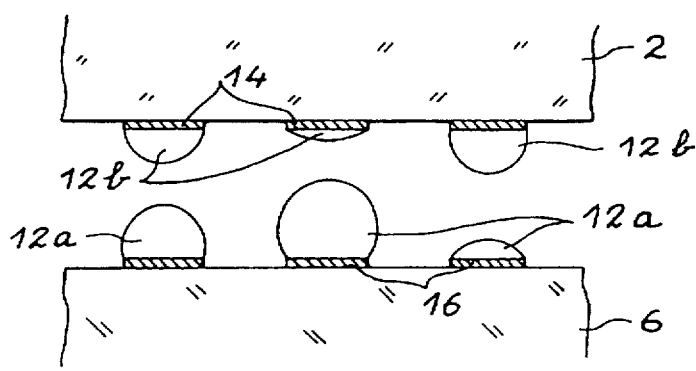
FIG. 4B, already described, diagrammatically the non-conservation of the volume of the indium bumps permitting the hybridization of a detection module, when the latter is separated from the interconnection network support of the device of FIG. 1.
Figure 5A:
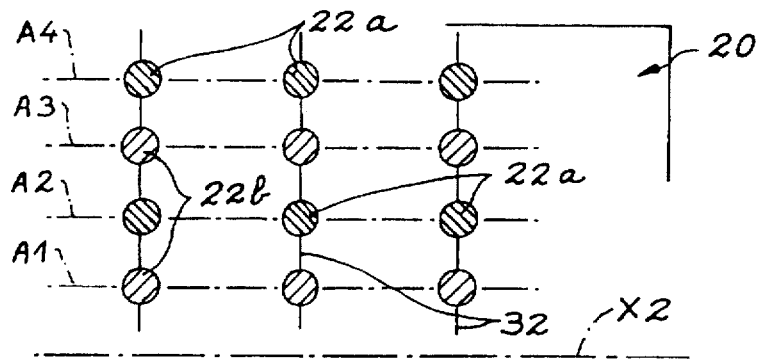
FIG. 5A, a partial, diagrammatic view of an interconnection network support usable for performing a process according to the invention.
Figure 5A:
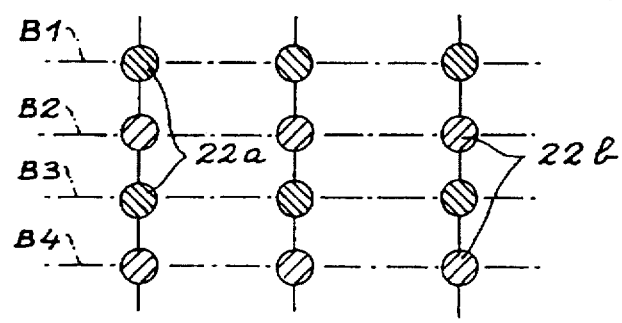

FIG. 5A is a partial, diagrammatic, plan view of the interconnection network support 20. Thus, FIG. 5A shows the upper face of said support, which carries the interconnection blocks on which are located the indium wafers 22a, 22b (said connection blocks being invisible in FIG. 5A). The support 20 is shown prior to the hybridization of the detection module.

Figure 5B:
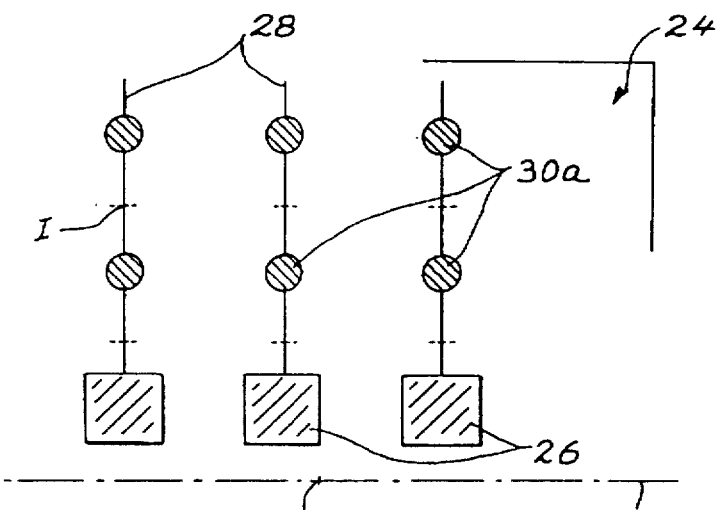
FIG. 5B, a partial, diagrammatic view of a detection module usable with the support shown in FIG. 5A for performing the process according to the invention.
Figure 5B:
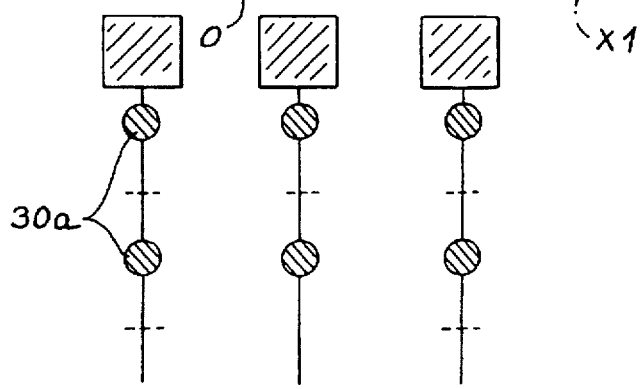

This detection module is diagrammatically and partially shown in FIG. 5B, where it carries the reference 24. FIG. 5B shows the face of said detection module from the side on which is located the photosites 26.

The module 24 also has electrical connections 28 connecting the photosites to a not shown reading circuit by means of the support 20, when said module 24 is hybridized to said support.

FIG. 5B also shows connection blocks 30a in electrical contact with the connections 28. These connection blocks 30a are wettable by indium, whereas their environment is not.

FIG. 5A shows electrical connections 32 in electrical contact with the welding wafers 22a and 22b by means of connection blocks not visible in FIG. 5A. These blocks are wettable by indium, whereas their environment is not.

Each of the electrical connections 32 makes it possible to transmit the signal from a photosite to the corresponding reading circuit. Thus, said signal passes from the photosite to said reading circuit by means of the corresponding electrical connections 28 and 32.

According to the invention, in order that the module replacing the module 24 hybridized on the support 20 can be precisely located in the position of said module 24, the replacement module is hybridized in an environment retaining the integrality of the volume of the indium bumps formed during the hybridization of the module 24 on support 20.

According to the invention, to do this the number of indium wafers of the support 20 has been doubled compared with a conventional support of the type referred to in the description of FIGS. 1 to 4B.

One half of the wafers is allocated to the module 24 and the other half to the replacement module.

The blocks wettable by the indium, located on the module 24 and intended for the hybridization of said module, are positioned in such a way that they face the half of the indium wafers placed on the support 20 during the hybridization of said module 24.

Thus, following said hybridization, each indium bump formed, which is in contact with a block of support 20, ensures an electrical connection with the corresponding block of module 24.

The other half of the indium bumps formed during hybridization faces surfaces of the module not wettable by the indium, is flattened in contact with these module surfaces and ensures no electrical connection.

During the dehybridization (module replacement), these flattened bumps are not modified from the standpoint of the volume and assume a virtually spherical shape.

During the hybridization of the replacement module, these bumps permit the installation thereof by self-alignment, very precisely in the position occupied by the preceding module 24.

As will be better shown hereinafter, a particular arrangement of the connection blocks makes it possible to use the same module type both during the first hybridization (hybridization of module 24) and during the hybridization of the replacement module.

It is merely necessary to turn round the replacement module compared with the position occupied by the replaced module (when the latter has been hybridized), in such a way that all the connection blocks of said replacement module are positioned facing indium bumps, which were not used during the hybridization of the module 24.

More specifically, in the example shown in FIGS. 5A and 5B, the photosites of module 24 are arranged in staggered manner and are located on either side of the median axis X1 of said module.

The support 20 also has a median axis X2, which is made to coincide with the axis X1 during the hybridization of the module 24 and the support 20.

The indium wafers 22a, 22b are placed on either side of the axis X2 constituting a superimposing axis.

The support 20 need only have two indium wafers per photosite, but preferably has a multiple of two, e.g. four, as can be seen in FIG. 5A, for electrical and thermal redundancy reasons and for a better mechanical holding of the module on the support.

The number of connection blocks 30a (wettable by indium) of the module 24 is very precisely equal to half the total number of indium wafers 22a, 22b of the support 20.

As can be seen in FIG. 5A, the indium wafers are located on lines A1, A2, A3 and A4 placed on one side of the axis X2 and parallel to said axis and on other lines B1, B2, B3 and B4, also parallel to the axis X2 and placed on the other side thereof.

The blocks of the module 24, which are wettable by indium, are placed on one side of the axis X1, so as to be able to come in contact with the indium wafers 22a of lines A2 and A4 and on the other side of the axis X1, so as to be able to come in contact with the indium wafers 22a of lines B1 and B3.

Instead of having connection blocks, the module 24 has zones which are not wettable by indium and corresponding with the indium wafers of lines A1 and A3. In the same way, said module 24, instead of having connection blocks, has zones not wettable by indium, corresponding with the indium wafers of lines B2 and B4.

Thus, following the dehybridization of the module 24, the indium bumps resulting from the indium wafers of lines A1, A3, B2 and B4, which were bearing against the non-wettable zones of the module 24 remain intact. The replacement module used is identical to module 24.

The connection blocks of the replacement module are positioned in the same way as those of module 24. Moreover, the distribution of the photosites of each of these modules has a symmetry with respect to an axis perpendicular to the face carrying these photosites. The trace or plot of this axis on said face is designated O in FIG. 5B.

Figure 5C:
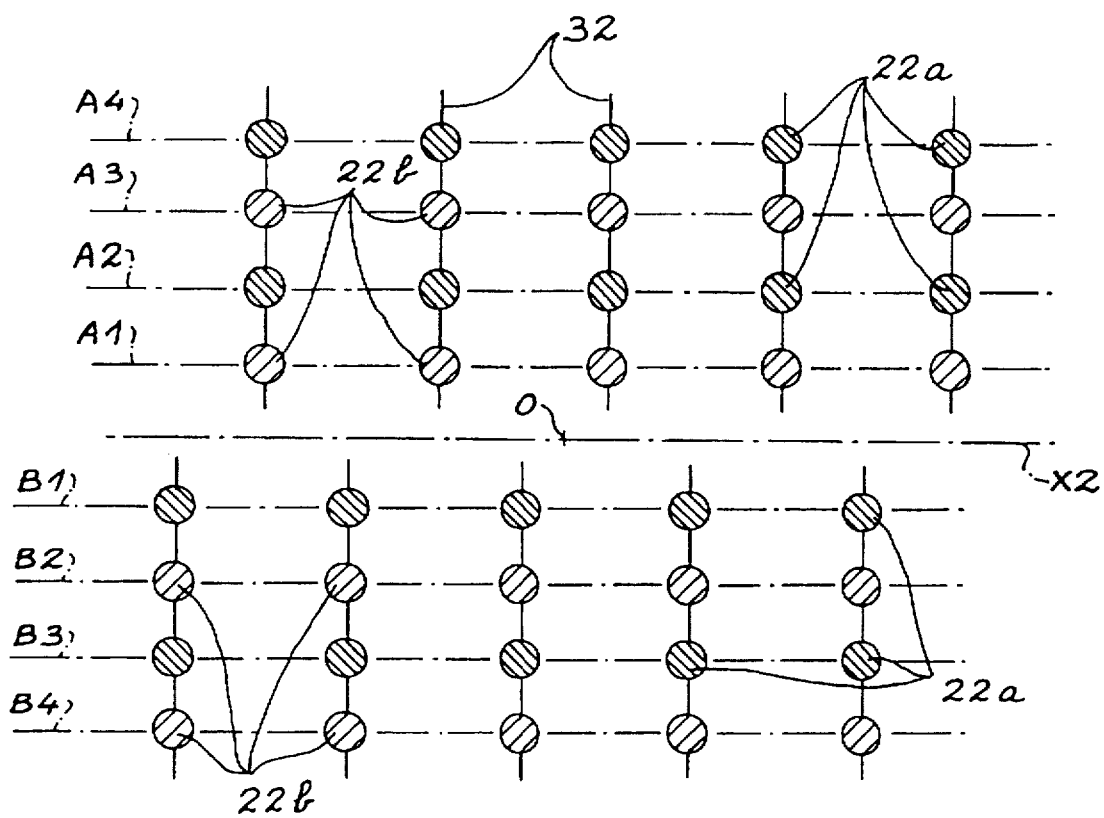
FIG. 5C, diagrammatically the process according to the invention.

In addition, as can be seen in FIG. 5C, the indium wafers 22b not used during the hybridization of the module 24 and located on lines A1, A3, B2 and B4 are deduced from the indium wafers 22a of lines A2, A4, B1, B3 used during the hybridization of the module 24 by a 180° rotation about an axis perpendicular to the face of the support carrying the indium wafers and whose trace or plot carries the reference O in FIG. 5C.

The same reference O is used as hereinbefore, because said axis coincides with the axis of symmetry, whose plot appears in FIG. 5B (when the module of FIG. 5B is hybridized to the support). Moreover, for each module, the centre I of each non-wettable zone (FIG. 5B) is deduced, by said axial symmetry, from the centre of one of the blocks 30a of the module.

Prior to the hybridization of the replacement module, the latter undergoes a 180° rotation about the axis O (the face of the replacement module on which are located the connection blocks facing the face of the support carrying the indium bumps and parallel to said face), with respect to the position occupied by the module 24 when it was hybridized.

Thus, the connection blocks of the replacement module come into contact with the bumps corresponding to the indium wafers 22b of lines A1, A3, B2 and B4, said bumps being intact following the dehybridization of the module 24.

Figure 6A:
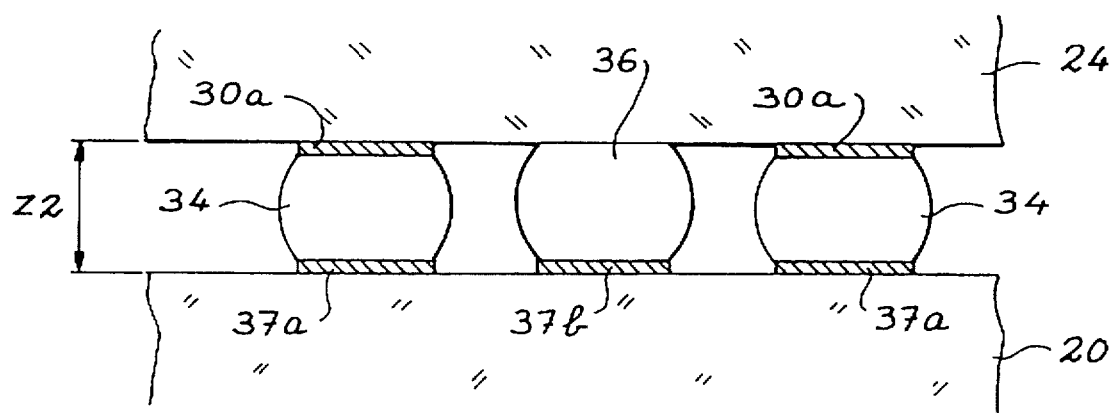
FIG. 6A, diagrammatically the hybridization of a detection module on the interconnection network support in accordance with the process of the invention.

FIG. 6A is a diagrammatic, partial, sectional view of the module 24 hybridized to the interconnection network support 20. FIG. 6A shows two indium bumps 34 welded on one side to the blocks 37a of the support 20 and on the other to the blocks 30a of the module 24.

It is also possible to see an indium bump 36 resting on a block 37b of the support 20, but which is not welded to the detection module 24, because it is in contact with a surface not wettable by the indium of said module 24.

There is no electrical connection between the support 20 and the module 24 at said indium bump 36.

According to the respected specifications, the module 24 is at a distance Z2 from the support 20.

With regards to the hybridization of the module 24, reference should be made to the aforementioned document.

It is merely pointed out that for said hybridization, the connection blocks 30a of the module 24 are contacted with the corresponding indium wafers 22a of the support 20 and the assembly of the module and the support obtained is raised to the melting point of indium, which leads to the formation of the indium bumps 34, 36. After cooling, hybridization is effected.

Figure 6B:
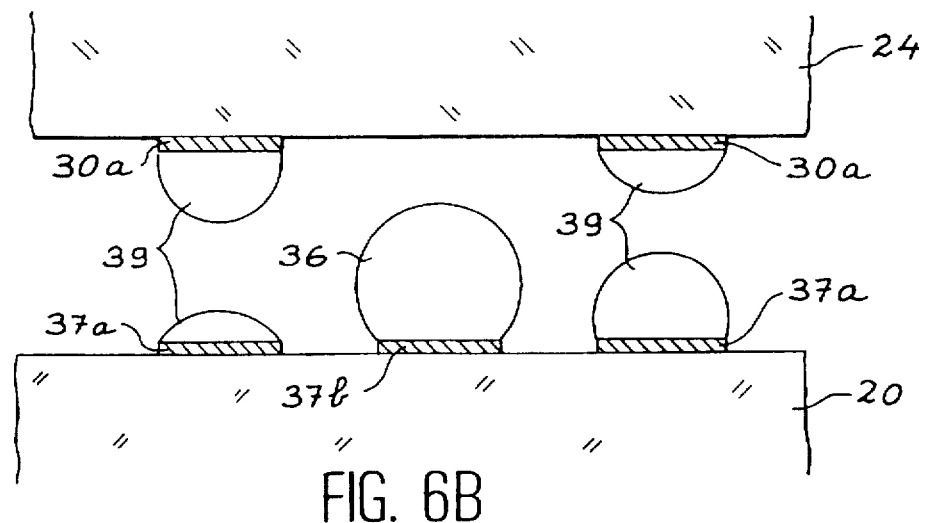
FIG. 6B, diagrammatically the dehybridization of the detection module of FIG. 6A.

FIG. 6B is a partial, diagrammatic, sectional view of support 20 and module 24 following the dehybridization of the module 24. The indium bump 36, which had the shape of a flattened sphere, now has a virtually spherical shape, as can be seen in FIG. 6B.

However, the bumps 34 which were welded to the blocks 30a, 37a, are located on these various blocks with volumes 39, which are different and whose distribution is entirely random.

Figure 7A:
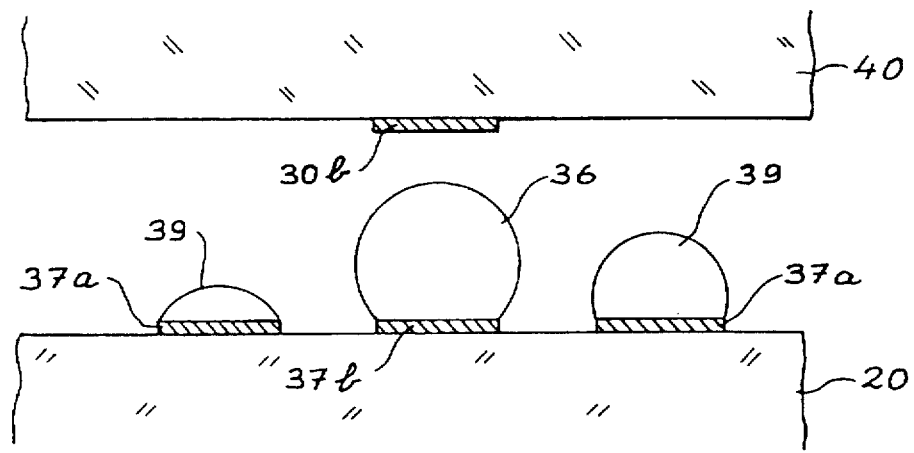
FIG. 7A, diagrammatically the replacement of said detection module by another detection module during the process according to the invention.

FIG. 7a is a partial, diagrammatic, sectional view of the replacement module 40, which is moved towards the interconnection network support 20 in order to hybridize said module 40. The latter has connection blocks such as the block 30b, which are intended to come into contact with the indium bumps 36 which have remained intact.

The indium volumes 39 remaining on the connection blocks 37a of the support 20 face zones of the replacement module 40 not wettable by indium.

For the hybridization of the replacement module 40, its connection blocks 30b are contacted with the corresponding bumps 36 of the support 20 and the assembly obtained is raised to the melting point of indium. This assembly is then cooled and hybridization is effected.

Figure 7B:
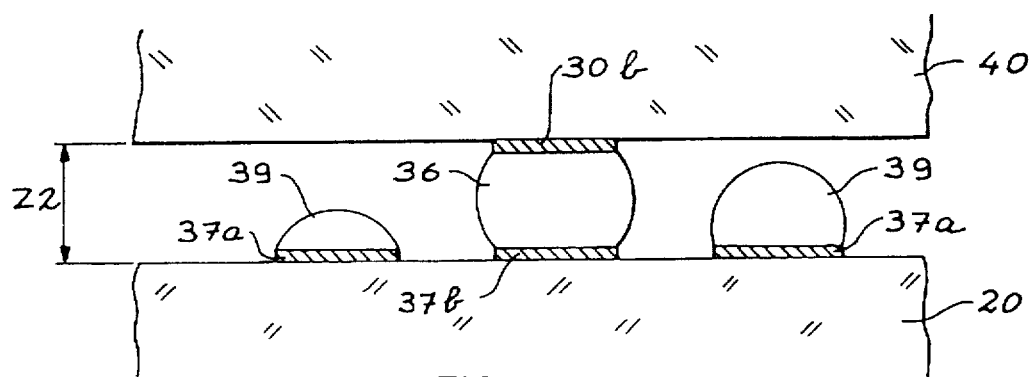
FIG. 7B, diagrammatically the hybridization of said other replacement module to the interconnection network support.

FIG. 7B is a partial, diagrammatic, sectional view of the replacement module 40 hybridized to the interconnection network support 20. FIG. 7B shows that the indium bumps such as bump 36 are welded on one side to the blocks of the support 20, such as the block 37b, and on the other side to the blocks of the module 40, such as the block 30b.

The indium volumes 39 are not welded to said module 40. This hybridization of the module 40 respects the specifications laid down. The hybridization of the replacement module 40 enables the latter to be located at the same distance Z2 from the support 20 as previously.

We claim:

1. Process for exchanging a first detection module hybridized to an interconnection support by welding bumps, comprising: providing an interconnection support having (a) at least one first group of welding elements for the hybridization of the first detection module thereto, and (b) at least one second group of welding elements for the hybridization of a second detection module replacing the first detection module, the first detection module having connection blocks having a surface wettable by the weld arranged with said wettable surface facing the elements of the first group of welding elements during hybridization, said first detection module having zones intended for being positioned facing elements of the second group of welding elements during said hybridization which are non-wettable by the weld; providing a replacement detection module having connection blocks whose surface is wettable by the weld and positioning the replacement detection module with said connection blocks facing elements of the second group of welding elements during the hybridization of said replacement detection module on the interconnection support, the zones of the replacement detection module which are positioned facing elements of the first group of welding elements during said hybridization being non-wettable by the weld; and, exchanging the first detection module hybridized by means of the first group of welding elements by dehybridization of said first detection module, with the replacement detection module being hybridized by means of the second group of welding elements; the second group of welding elements being deduced from the first group of welding elements by 180° rotation about an axis perpendicular to the face of the interconnection support carrying said first and second groups of welding elements; and, hybridizing the replacement detection module on the interconnection support after having been placed in a position deduced, by said rotation, from the position occupied by the first detection module when it was hybridized.

2. The process according to claim 1, wherein the detection elements of each module are distributed symmetrically with respect to an axis perpendicular to the face of the module carrying said detection elements.

3. The process according to claim 2, wherein the interconnection support comprises two first groups of welding elements and two second groups of welding elements.

4. The process according to claim 2, wherein the welding elements of each first and second groups of welding elements are welding wafers.

5. The process according to claim 2, wherein the weld is of a material selected from the group consisting of indium, tin, lead and a metal alloy containing indium, tin or lead, said metal alloy having a melting point which does not exceed 350° C.

6. The process according to claim 1, wherein the interconnection support comprises two first groups of welding elements and two second groups of welding elements.

7. The process according to claim 6, wherein the welding elements of each first and second groups of welding elements are welding wafers.

8. The process according to claim 3, wherein the weld is of material selected from the group consisting of tin, lead and a metal alloy containing indium, tin or lead, said metal alloy having a melting point which does not exceed 350° C.

9. The process according to claim 1, wherein the welding elements of each first and second groups of welding elements are welding wafers.

10. The process according to claim 9, wherein the weld is of material selected from the group consisting of tin, lead and a metal alloy containing indium, tin or lead, said metal alloy having a melting point which does not exceed 350° C.

11. The process according to claim 1, wherein the weld is of a material selected from the group consisting of indium, tin, lead and a metal alloy containing indium, tin or lead, said metal alloy having a melting point which does not exceed 350° C.

* * * * *